(12) United States Patent
Sabbineni et al.

(10) Patent No.: US 9,747,958 B2
(45) Date of Patent: Aug. 29, 2017

(54) DEVICE SOFT-START MANAGEMENT FOR ENUMERATION PROBLEMS WITH USB HOSTS

(71) Applicant: SanDisk Technologies Inc., Plano, TX (US)

(72) Inventors: Srinivasa Rao Sabbineni, Bangalore (IN); Jayanth Mysore Thimmaiah, Bangalore (IN); Anand Venkitachalam, Bangalore (IN); Bhavin Odedara, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 18 days.

(21) Appl. No.: 14/928,005

(22) Filed: Oct. 30, 2015

(65) Prior Publication Data

US 2017/0125068 A1    May 4, 2017

(51) Int. Cl.
*G11C 5/14*   (2006.01)
*G11C 7/20*   (2006.01)

(52) U.S. Cl.
CPC ............... *G11C 5/147* (2013.01); *G11C 7/20* (2013.01)

(58) Field of Classification Search
USPC .... 365/189.07, 189.09, 226, 185.17, 185.33, 365/229
See application file for complete search history.

(56) References Cited

U.S. PATENT DOCUMENTS

| | | | | |
|---|---|---|---|---|
| 5,490,117 A * | 2/1996 | Oda | ................. | G01R 31/31715 365/226 |
| 7,203,104 B2 * | 4/2007 | Hijikata | ................. | G11C 5/143 365/189.07 |
| 7,596,048 B2 * | 9/2009 | Kamiyama | ............ | G11C 5/143 365/226 |
| 8,675,420 B2 * | 3/2014 | Tanzawa | .............. | G11C 7/1066 365/189.09 |
| 8,792,273 B2 * | 7/2014 | Ellis | .................... | G06F 11/1441 365/185.33 |

* cited by examiner

*Primary Examiner* — Vu Le
(74) *Attorney, Agent, or Firm* — Brinks Gilson & Lione

(57) ABSTRACT

An electronic device may receive a supply voltage from another external device, and detect when a level of the supply voltage drops below a threshold. In response, a controller of the electronic device may deactivate an interface configured for communication with the other electronic device. The controller may manage time periods and time period counters to determine when the check whether to reactivate the interface or conclude that the other external device is non-compliant.

20 Claims, 3 Drawing Sheets

DEVICE SOFT-START MANAGEMENT FOR ENUMERATION PROBLEMS WITH USB HOSTS

BACKGROUND

A memory device may be configured to receive power from a host to which it is connected. During an initial time period that the host is supplying the power, the memory device may begin consuming the power and drawing current. In some situations, during this initial time period, the amount of current being drawn may be more than what the host may be configured to supply. These situations may occur, for example, because the host is noncompliant with an associated specification or protocol (e.g., a Universal Serial Bus (USB) protocol) in that the host is configured to supply a lower amount of current than what the specification allows the memory devices to consume during this initial time period. As a result, a voltage level of the power supply may begin to drop. Consequently, regulators of the memory device may stop performing in their respective regulation modes. Also, the amount of current drawn may increase and in some cases may spike. Ultimately, the host may stop supplying power altogether, shutting down its connection and preventing communication between the two devices.

Some hosts may be configured to switch to a higher power mode after the initial period, at which point they may be configured to supply the amount of current that the memory device wants to draw without detecting a problem. Prior solutions to address this problem have taken advantage of this aspect of the hosts and have implemented a front end controller that delays an initial ramp up of the power supply to the primary controller of the memory device. By delaying the initial ramp up, the memory device may begin drawing the current after the host has switched to its higher power mode.

However, implementing both the front end delay controller and the actual memory controller may be costly. In addition, the amount of delay provided by the initial controller may be fixed. As a consequence, the amount of delay may not be long enough for some existing or later developed hosts. Yet, if the delay is too long, then unnecessary time may be wasted where the memory device could otherwise be operating. As such, a less costly and/or more flexible way for communicating with non-compliant hosts that do not supply a sufficient amount of current during an initial phase or time period may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Figure 1:
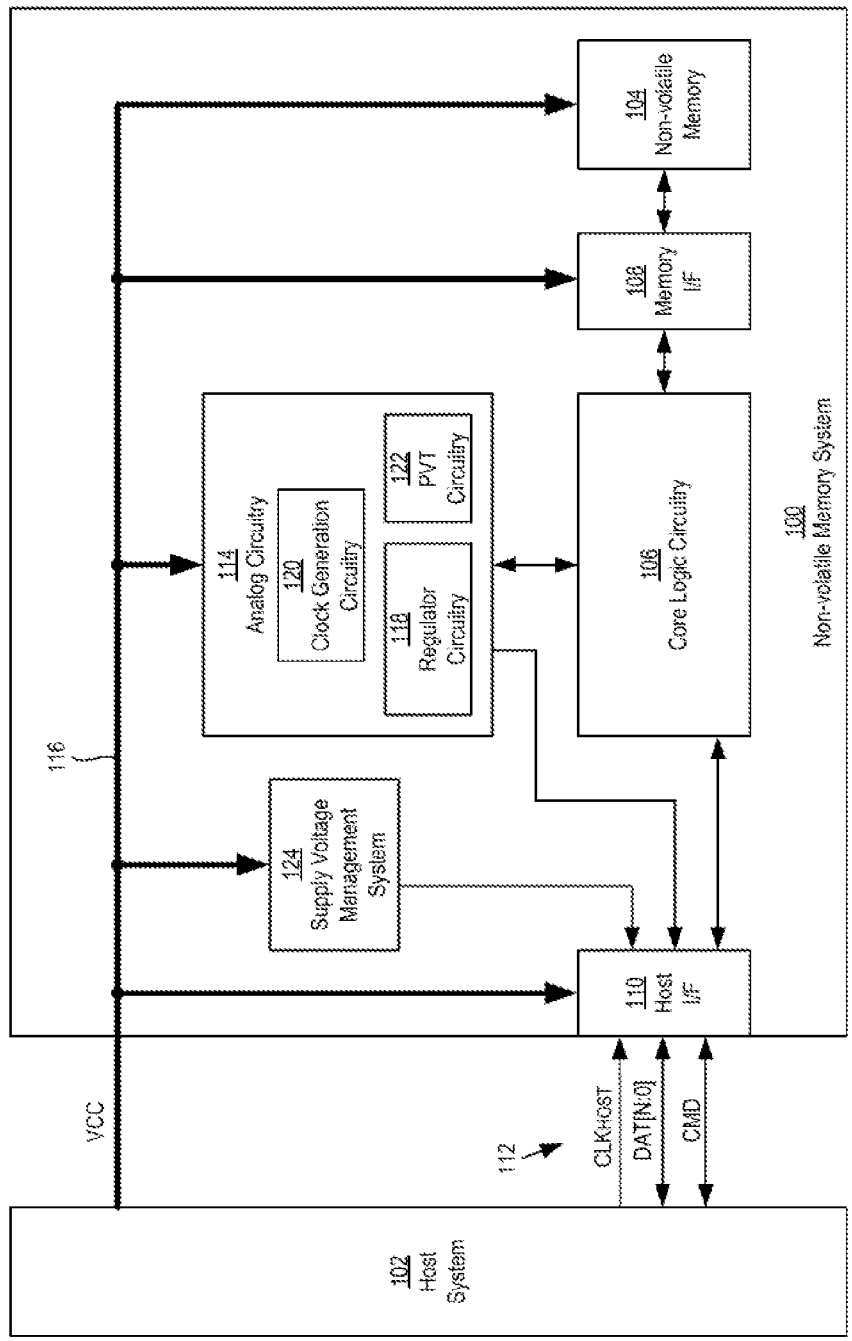
FIG. 1 is a block diagram of an example non-volatile memory system that includes a supply voltage management system.

The following embodiments describe systems and related methods of handling initialization procedures for an electronic device in the event that a supply voltage drops below a threshold level. In a first embodiment, an electronic device may include an interface, a supply voltage detection circuit, and a controller. The interface may be configured to communicate with an external device. The supply voltage detection circuit may be configured to detect a supply voltage level relative to a threshold. The controller may be configured to deactivate the interface when the supply voltage level drops below the threshold, and activate the interface when the supply voltage level increases back to above the threshold.

In some embodiments, the electronic device may include a storage circuit may be configured to store a supply voltage level indicator that indicates whether the supply voltage level is above or has fallen below the threshold. The controller may further be configured to access the storage circuit to determine whether to activate the interface.

In some embodiments, the supply voltage detection circuit may further be configured to set the supply voltage level indicator to a first value upon detection that the supply voltage level has dropped below the threshold, and set the supply voltage level indicator to a second value upon detection that the supply voltage level has increased back to above the threshold.

In some embodiments, the electronic device may include an interrupt circuit configured to receive an output signal from the supply voltage detection circuit, generate an interrupt signal when the output signal indicates that the supply voltage level has dropped below the threshold, and output the interrupt signal to the controller. The controller may be configured to deactivate the interface in response to receipt of the interrupt signal.

In some embodiments, the controller may further be configured to: stop execution of a core initialization process when the supply voltage level drops below the threshold, and resume execution of the core initialization process when the supply voltage level increases back to above the threshold.

In some embodiments, the controller may further be configured to start a time period when the supply voltage level drops below the threshold, and determine whether to activate the interface upon expiration of the time period.

In some embodiments, the controller may further be configured to: increment a count index when the time period expires, and identify that the external device is noncompliant for communication with the interface when the count index reaches a count threshold.

In some embodiments, the threshold may include a threshold range, and the controller may be configured to deactivate the interface when the supply voltage level drops below the threshold range and to activate the interface when the supply voltage level increases back to above the threshold range.

In another embodiment, a method may include: transitioning, with a supply voltage detection circuit of an electronic device, an output signal from a first level to a second level in response to a supply voltage level falling below a threshold; generating, with an interrupt circuit of the electronic device, an interrupt signal in response to the transitioning; deactivating, with a controller of the electronic device, a host interface configured for communication with a host system in response to detecting the interrupt signal; and checking, with the controller, whether the supply voltage level has increased to above the threshold after each of a plurality of time periods until either the supply voltage level has increased to above the threshold, or a predetermined number of the time periods has elapsed and the supply voltage level has not increased to above the threshold.

In some embodiments, the method may further include activating, with the controller, the host interface when the supply voltage level increases to above the threshold prior to a last of the predetermined number of time periods expiring.

In some embodiments, the method may further include: identifying, with the controller, that the host system is noncompliant for communication with the electronic device when the last of the predetermined number of time periods expires and the supply voltage level has not increased to above the threshold.

In some embodiments, the method may further include storing, with a storage circuit, a supply voltage level indicator that indicates whether the supply voltage level is above or below the threshold. Also, checking whether the supply voltage level has increased to above the threshold may include accessing, with the controller, the storage circuit to determine a value of the supply voltage level indicator.

In some embodiments, the method may further include setting, with the supply voltage detection circuit, the value of the supply voltage level indicator to correspond to the first level or the second level of the output signal.

In some embodiments, the method may further include: stopping, with the controller, a core initialization process in response to detecting the interrupt signal.

In some embodiments, the threshold may include a threshold range, and transitioning the output signal may include transitioning, with the supply voltage detection circuit, the output signal from the first level to the second level in response to the supply voltage level falling from above a high level of the threshold range to below a low level of the threshold range. The method may also include, after transitioning the output signal from the first level to the second level, transitioning, with the supply voltage detection circuit, the output signal from the second level back to the first level in response to the supply voltage level increasing from below the low level of the threshold range to above the high level of the threshold range.

In another embodiment, an electronic device may include an interface configured to communicate with a host system, a supply voltage detection circuit configured to detect that a supply voltage level has dropped below a threshold, and a controller. The controller may be configured to deactivate the interface in response to the detection that the supply voltage level has dropped below the threshold, and before a last of a plurality of time periods expires, check at least once whether to activate the interface.

In some embodiments, the controller may further be configured to reactivate the interface when the supply voltage level increases to above the threshold, after deactivation of the interface.

Other embodiments are possible, and each of the embodiments can be used alone or together in combination. Accordingly, various embodiments will now be described with reference to the attached drawings.

The following embodiments describe systems and related methods of handling initialization procedures in the event that a supply voltage drops below a threshold level. Before turning to these and other embodiments, the following paragraphs provide a discussion of an exemplary non-volatile memory system can be used with these embodiments. Of course, these are just examples, and other suitable types of non-volatile memory systems, storage modules, or other types of electronic devices or apparatuses can be used.

FIG. 1 shows a block diagram of an example non-volatile memory system 100 connected to and/or in communication with a host system 102. In one embodiment, the non-volatile memory system 100 may configured for removable connection with the host system 102, such as a Universal Serial Bus (USB) flash drive or a card based system (e.g., a secure digital (SD) or a micro secure digital (micro-SD) card). In another embodiment, the non-volatile memory system 100 may be part of an embedded memory system. The host system 102 may be any electronic system or device that is configured to communicate and/or operate with the non-volatile memory system 100.

The non-volatile memory system 100 may include non-volatile memory 104, which may include a plurality of non-volatile memory elements or cells, each configured to store one or more bits of data. The non-volatile memory elements or cells may be any suitable non-volatile memory cells, such as NAND flash memory cells and/or NOR flash memory cells in a two dimensional and/or three dimensional configuration. The memory cells may take the form of solid-state (e.g., flash) memory cells and can be one-time programmable, few-time programmable, or many-time programmable.

The non-volatile memory system 100 may also include core logic circuitry 106 that performs memory management functions for the storage of data in the non-volatile memory 104. Example memory management functions may include, but not limited to, communicating with the host system 102, including receiving, handling, and responding to host requests or commands, such as read, write, erase, and status requests/commands received from the host system 102; formatting the non-volatile memory 104 to ensure it is operating properly; mapping out bad memory cells; allocating spare cells to be substituted for future failed cells; and transitioning the non-volatile memory system 100 between different states, operation modes, and/or power consumption modes. In operation, when the host system 102 needs to read data from or write data to the non-volatile memory 104, it may communicate with the core logic circuitry 106.

In addition, the non-volatile memory system 100 may include a memory interface (I/F) 108 that provides an interface between the core logic circuitry 106 and the non-volatile memory 104. The core logic circuitry 106 may be configured to communicate data and commands with the non-volatile memory 104 via the memory interface 108 to store data in and/or read data from the non-volatile memory 104. The non-volatile memory system 100 may also include a host interface 110 to communicate with the host system 102. The host interface 110 may be coupled to a communications bus 112 on which the interface 110 sends and receives signals to and from the host system 102. The host interface 110 may include a plurality of input/output (I/O) driver circuits that are configured to generate signals, such as by pulling up and down voltages on the lines of the communications bus 112. The host interface 110 and the communications bus 112 may be of any of various types and/or configured in accordance with any of various specifications or protocols, such as non-volatile memory express (NVMe), fiber channel over Ethernet (FCoE), secure digital (SD), micro secure digital (micro-SD), Universal Serial Bus (USB), Serial AT Attachment (SATA), SATA Express, Serial Attached Small Computer System Interface (SAS), Peripheral Component Interconnect Express (PCIe), or embedded MultiMediaCard (eMMC), as non-limiting examples.

In the example configuration shown in FIG. 1, the communications bus 112 may include a host clock line $CLK_{HOST}$ on which the host system 102 may send a host clock signal to the non-volatile memory system 100; an N-number of data lines DAT[N-1:0] on which the host system 102 and the non-volatile memory system 100 may communicate data signals with each other; and a command line CMD on which the host system 102 and the non-volatile memory system 100 may communicate command signals and responses with each other. The data signals may include data that the host system 102 wants stored in or read from the non-volatile memory system 100. Command signals sent from the host system 102 may instruct or request that the non-volatile memory system 100 perform some action, such as perform an operation, transition into a certain state, or respond with requested information, as examples. The response signals sent from the non-volatile memory system 100 may acknowledge receipt of the command signals, indicate that the instructed/action is performed, or include the requested information, as examples. The host clock signal may set the frequency of the communications bus 112 and/or control the data flow by providing the times and/or rates at which the clock and data signals may be sampled by the non-volatile system 100. Also, the host system 102 may supply a supply voltage VCC on a supply line 116 to power components of the non-volatile memory system 100.

The non-volatile memory system 100 may also include analog circuitry 114, which may include regulator circuitry 118 configured to output one or more regulator supply voltages to the core logic circuitry 106, including a core supply voltage. In addition, the analog circuitry 114 may include clock generation circuitry 120 configured to provide a base clock signal to the core logic circuitry 106, and process, voltage, temperature (PVT) circuitry 122 configured to detect and/or compensate for any process, voltage, and/or temperature variations. Other circuitry and/or functions of the analog circuitry 114 may be possible. Also, the core logic circuitry 106 may send one or more control signals to the analog circuitry 114 to configure, program, enable, and/or disable various components of the analog circuitry 114.

When the host system 102 begins supplying power to the non-volatile memory system 100 on the supply line 116 during an initial time period, the components of the non-volatile memory system 100 may begin operating and consuming the power, drawing current in the process. If the non-volatile memory system 100 starts drawing more current than the host system 102 is expecting and/or is configured to supply, the level of the supply voltage VCC may begin to drop. In some situations, the host system 102 may think there is a problem with the non-volatile memory system 100 and stop supplying power on the supply line 116.

In some of these situations, when the level of the supply voltage VCC drops or the host system 102 stops supplying power, the non-volatile memory system 100 may have already exited a power up or reset phase and started initialization and enumeration phases. The non-volatile memory system 100 may include a supply voltage management system 124 that is configured to manage certain components of the non-volatile memory system 100 when the level of the supply voltage drops below a threshold level.

Figure 2:
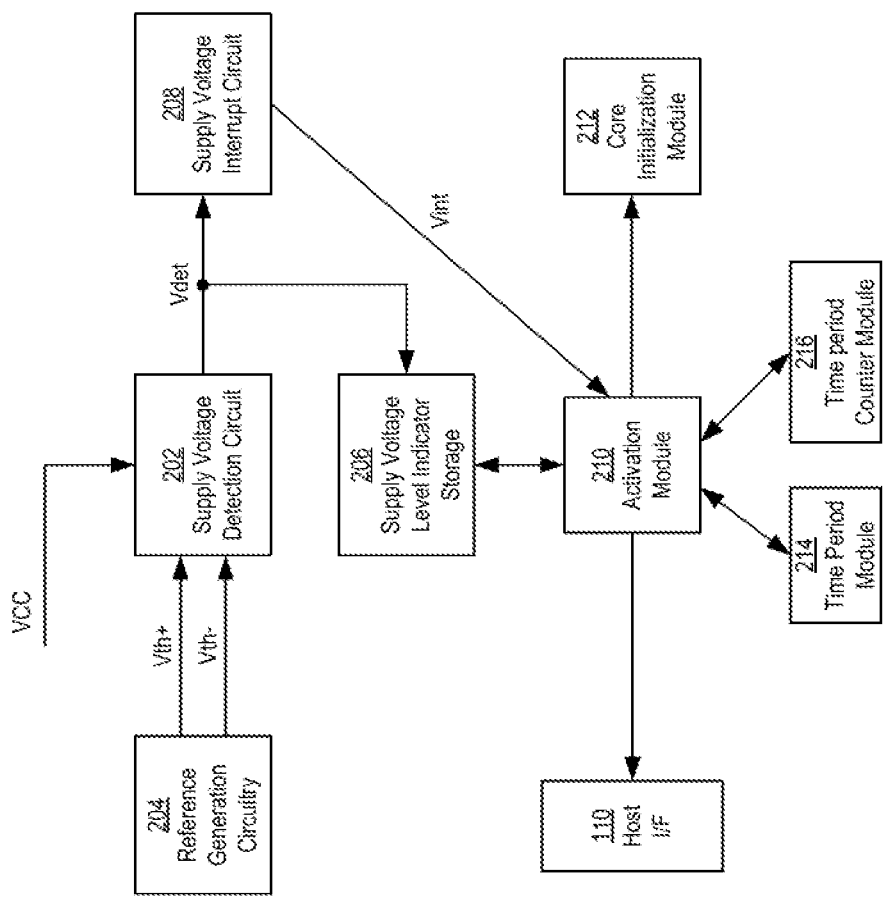
FIG. 2 is a block diagram of the supply voltage management system of FIG. 1 in further detail.

FIG. 2 shows the supply voltage management system 124 in further detail. The supply voltage management system 124 may include a supply voltage detection circuit 202 that is configured to detect a level of the supply voltage VCC relative to a threshold Vth. The supply voltage management system 124 may include or be in communication with reference generation circuitry that is configured to generate the threshold Vth and supply the threshold Vth to the supply voltage detection circuit 202. In the example configuration shown in FIG. 2, the threshold Vth may be a threshold range defined by a first threshold voltage generated at a high threshold level Vth+ and a second threshold voltage generated at a low threshold level Vth−, although in other example configurations, the threshold Vth may be a single level.

The supply voltage detection circuit 202 be configured to compare, such as by including comparator circuitry, the supply voltage VCC with the reference Vth, and generate an output signal Vdet indicative of the comparison. When the level of the supply voltage VCC is lower than the threshold Vth, then the supply voltage detection circuit 202 may generate and output the output signal Vdet at a first (e.g., low) level, and when the level of the supply voltage VCC is higher than the threshold Vth, then the supply voltage detection circuit 202 may generate and output the output signal Vdet at a second (e.g., high) level.

With reference to the particular configuration shown in FIG. 2, use of the threshold range and the low and high threshold levels Vth−, Vth+ may provide a hysteretic comparison in order to generate the output signal Vdet. In particular, when the level of the supply voltage VCC starts below the high threshold Vth+, the supply voltage detection circuit 202 may be configured to output the threshold Vth at the first (low) level (regardless of whether the level of the supply voltage VCC is above or below the low threshold Vth−. Then, when the level of the supply voltage VCC rises above the high threshold Vth+, the supply voltage detection circuit 202 may be configured to output the output signal Vdet at the second (high) level. If the level of the supply voltage VCC drops below the high threshold Vth+ but remains above the low threshold Vth, the supply voltage detection circuit 202 may be configured to maintain the output signal Vth at the second level. However, if the level of the supply voltage VCC drops below the low threshold Vth−, then the supply voltage detection circuit 202 may be configured to transition the output signal Vdet from the second level back to the first level. The hysteretic effect of using two threshold levels Vth+ and Vth− may help to prevent the supply voltage detection circuit 202 from falsely identifying fluctuations in the level of the supply voltage VCC as being a drop in the supply voltage level due to current supply issues.

The supply voltage management system 124 may also include supply voltage level indicator storage 206 that is configured to store a supply voltage level indicator, which may indicate the level of the supply voltage VCC relative to the threshold Vth. In some example configurations, the storage 206 may be configured as a register, although other configurations may be possible. The value of the indicator and/or what the indicator indicates may be set by the supply voltage detection circuit 202 and/or correspond to the output signal Vdet of the supply voltage detection circuit 202.

The supply voltage management system 124 may further include a supply voltage interrupt circuit 208 that is configured to receive the output signal Vdet from the supply voltage detection circuit 202, and detect if/when the level of the supply voltage VCC drops below the threshold Vth based on the output signal Vdet. For example, the supply voltage interrupt circuit 208 may detect that the level of the supply voltage VCC has dropped below the threshold Vth when the supply voltage detection circuit transitions the output signal Vdet from the second level (indicating that the supply voltage level is above the threshold Vth) to the first level (indicating that the supply voltage level is below the threshold Vth). In one example configurations, the supply voltage interrupt circuit may include negative or falling-edge detection circuitry, although other configurations may be possible. The supply voltage interrupt circuit 208 may be configured to output an interrupt signal Vint that indicates whether or not it has detected that the level of the supply voltage VCC has fallen from above to below the threshold Vth.

In addition, the supply voltage management system 124 may include an activation module 210 that is configured to activate and deactivate the host interface 110. When the host interface 110 is activated, the host interface 110 may be able to operate to communicate with the host system 102. Circuitry of the host interface 110 may turn on and off to pull up and down voltages on the communications bus 112 to high and low levels, drawing current while doing so. When the host interface is deactivated, the host interface 110 may not be able to operate to communicate with the host 102, and its circuitry may not draw current (or draw a negligible amount of current).

As mentioned, the level of the supply voltage VCC may drop below the threshold Vth when the non-volatile memory system 100 is drawing more current than the host system 102 is expecting or configured for it to draw. Deactivating the host interface 110 when the supply voltage level drops below the threshold Vth may be desirable because the host interface 110 may be one of, if not the, predominant current consumer of the non-volatile memory system. In one example configuration, a total current consumption of the non-volatile memory system 100 during an initial period may be about 70 milliamps (mA), and the host interface 110 may draw 60 of the 70 mA. By deactivating the host interface 110, the current consumed by the non-volatile memory system 100 may fall to a level that the host system 102 can handle, thereby allowing the level of the supply voltage VCC to rise back above the threshold voltage Vth.

In some example configurations, the activation and deactivation of the host interface 110 may correspond to a power on reset (POR) (or simply reset) state. When the host interface 110 is in the POR state, it may be deactivated and unable to communicate with the host system 102. Alternatively, when the host interface 110 exits or is released for the POR state, then it may be activated and able to communicate with the host system 102.

Referring back to FIG. 1, the non-volatile memory system 100 may be configured to maintain or manage two POR states, including a first POR state for the host interface 110 (referred to as a physical interface (PHY) POR state, and a second POR state for the analog circuitry 114 and/or the core logic circuitry 106 (referred to as a chip POR state). In the chip POR state, the core logic circuitry 106 may be unable to handle or unresponsive to host command or requests, such as read and write commands, from the host system 102. For some example configurations, the PHY POR state may depend on the chip POR state. That is, when the analog circuitry 114 and/or the core logic circuitry 106 is in the chip POR state, then the host interface 110 may be in the PHY POR state, and when the analog circuitry 114 and/or the core logic circuitry 106 exit or are released from the chip POR state, then the host interface 110 may exit or be released from the PHY POR state.

However, for non-volatile memory systems that include the supply voltage management system 124, the PHY POR state for the host interface 110 may be set independent of the core POR state. In particular, referring back to FIG. 2, the activation module 210 may be configured to activate the host interface 110 (release it from the PHY POR state) and deactivate the host interface 110 (set it in the PHY POR state) independent or regardless of the chip POR state.

In further detail, during an initial power up, the analog circuitry 114 and/or the core logic circuitry 106 may be in the chip POR state and the host interface 110 may be in the PHY POR state. The level of the supply voltage VCC may rise above the threshold Vth, and in response, the supply voltage detection circuit 202 may output the output signal Vdet at the second level. In addition, the analog circuitry 114 may receive the supply voltage VCC and in response, output a regulated core voltage to the core logic circuitry. Subsequently, the analog circuitry 114 and/or the core logic circuitry 106 may exit the chip POR state, which in turn may cause the host interface 110 to exit the PHY POR state.

When the core logic circuitry 106 and the host interface 110 exit their respective chip POR and PHY POR states, they may each be configured to perform respective initialization processes and/or be in respective initialization phases. When the core logic circuitry 106 exits the chip POR state, a core initialization module 212 may begin an initialization process during which the core initialization module 212 may perform certain actions to initialize the core logic circuitry 106 and the non-volatile memory 104 so that they may handle host commands and other operations associated with managing the storage of data in the non-volatile memory 104. Example actions may include accessing and/or executing boot code or a boot sequence, initializing dies of the non-volatile memory 104 (during which the dies may enter their own POR states and load various parameters in order to perform various memory operations), and loading firmware and address information into random access memory (RAM), as non-limiting examples.

In addition, when the host interface 110 exits the PHY POR state, the host interface 110 may be activated and begin performing its initialization process, during which the host interface 110 may begin communicating with the host system 102 to establish a communication link or connection with the host system 102. The initialization process may include an enumeration phase and/or a negotiation phase, during which the host interface 110 may perform certain actions—e.g., identify itself to the host system and/or negotiate certain communication parameters (e.g., operating voltage levels), as non-limiting examples—in order to establish the communication link or connection with the host system 102.

If the level of the supply voltage VCC falls below the threshold Vth, the supply voltage detection circuit 202 may transition its output signal Vdet from the second level to the first level. The supply voltage interrupt circuit 208 may detect the transition, and in response output the interrupt signal Vint to the activation module 210, indicating that the level of the supply voltage VCC has fallen below the threshold Vth. In response to receipt of the interrupt signal Vint, the activation module 210 may deactivate the host interface 110 (i.e., set it in the PHY POR state). The activation module 210 may be configured to deactivate the host interface 110 independent of the chip POR state of the analog circuitry 114 and/or the core logic circuitry 106. Also, if the activation module 210 receives the interrupt signal Vint when the host interface 110 is its initialization phase, then upon being deactivated, the host interface 110 may stop operating in and/or may exit from its initialization phase and enter into the PHY POR state. Similarly, if the activation module 210 receives the interrupt signal Vint when the core initialization module 212 is executing its initialization process, the activation module 210 may cause the core initialization module 212 to stop executing the initialization process upon receipt of the interrupt signal Vint.

Additionally, after the activation module 210 has deactivated the host interface 110, the activation module 210 may periodically check to see if it should activate (or reactivate)

the host interface 110. The activation module 210 may do so by periodically checking the supply voltage level indicator in the storage 206. As previously described, when the level of the supply voltage VCC falls below the threshold Vth, the supply voltage level indicator in the storage 206 may indicate that the level is below the threshold Vth. Similarly, when the level of the supply voltage VCC rises back to above the threshold Vth, the supply voltage level indicator may indicate that the level is above the threshold Vth. Accordingly, if the activation module 210 accesses the storage 206 and determines that the supply voltage level indicator still indicates that the level of the supply voltage VCC is below the threshold Vth, then the activation module 210 may determine to keep the host interface 110 deactivated. Alternatively, if the activation module 210 accesses the storage module 206 and determines that the supply voltage level indicator has changed to indicate that the level of the supply voltage VCC is now above the threshold Vth, the activation module 210 may activate the host interface 110. Additionally, if the core initialization module 212 stopped executing the initialization process, then if the indicator indicates that the level of the supply voltage VCC is above the threshold Vth, the activation module 210 may communicate with the core initialization module 212 to resume the core initialization process.

The activation module 210 may be configured to check the value of the indicator in the storage 206 at periodic time intervals or at the expiration of a time period. When the activation module 210 first receives the interrupt signal Vint, the activation module 210 may communicate with a time period module 214 to begin a time period. When the time period expires, then the activation module 210 may access the storage 206 to determine the value of the indicator in order to determine whether to activate the host interface 110. If the value of the indicator has not changed (i.e., it still indicates that the level of the supply voltage VCC is below the threshold Vth), then the activation module 210 may communicate with the time period module 214 to restart the time period.

The activation module 210 may also communicate with a time period counter module 216 that keeps track of the number of time periods that have begun. When the activation module 210 determines to restart the time period, the time period counter module 216 may increment a time period count (or count index). When a time period expires, the activation module 210 may check the storage 206 to determine if the indicator value has changed. If not, then before starting a new time period, the activation module 210 may check if the time period count maintained by the time period counter module 216 has reached a count threshold. If not, then the activation module 210 may start another time period. However, if the time period count has reached the count threshold, then the activation module 210 may determine not to start any further time periods and identify the host as noncompliant. If the activation module 210 determines that the host is noncompliant (or the activation module 210 simply determines that the time period count has reached the count threshold), then the activation module 210 may determine not to activate the host interface 110 or perform or attempt to perform initialization processes, including enumeration, until a new or next power up cycle when the non-volatile memory system 100 powers down and subsequently receives a power from the host system 102. For example, the core logic circuitry 106 and/or the analog circuitry 114 may enter back into the core POR state. Subsequently, the non-volatile memory system 100 may receive the supply voltage VCC on the supply line 116, causing the core logic circuitry 106 and/or the analogic circuitry 114 to exit the core POR state and in turn the host interface 110 to exit the PHY POR state. Prior to detecting the host interface 110 exiting the PHY POR state, the activation module 210 may determine not to activate the host or perform or attempt to perform initialization processes.

The use of the time period module 214 and the time period counter module 216 may provide the activation module 210 with flexibility in determining whether and/or when to activate the host interface 110 after the level of the supply voltage VCC falls below the threshold Vth. In some configurations, the host system 102 may be configured in a low power mode during an initial period that the host system 102 supplies power to the non-volatile memory system 100. During the low power mode, the host system 102 may be configured to supply up to a certain level of current. After the initial period, the host system 102 may be configured to enter into a high power mode, during which the host system 102 may be configured to supply a higher amount of current. If, during the initial period, the host system 102 is not configured to supply a desired amount of current that the memory system 100 wants to consume and the supply voltage VCC is dropping as a result, the host system 102 may nonetheless be configured to supply the desired amount of current when it enters into the high power mode. As such, for a noncompliant host system 102 that is configured to supply an insufficiently low amount of current during the initial period, it may be advantageous for the host interface 110 to be deactivated and not draw current until after the initial period when the host system 102 has transitioned into the high power mode.

The length or duration of the initial period may vary among different types of host systems 102. However, by utilizing the time period module 214 and the time period counter module 216, the activation module 210 may be able to check whether to activate the host interface 110 at least once before a last time period expires and the activation module 210 makes a final determination of whether to activate the host interface 110 or identify the host system 102 as noncompliant. Setting a total duration of the plurality of time periods to be long enough but checking frequent enough provides a flexible checking approach that allows the non-volatile memory system 100 to be connected with different types of noncompliant hosts having different initial period durations without the different hosts shutting down their respective power supplies due to the amount of current being consumed by the memory system 100. At the same time, by checking frequent enough, the activation module 210 may waste minimal or no time in between the time that the host enters the high power mode and the time that the memory system 100 activates the host interface 110. Further, deactivating the host interface 110 when the level of the voltage supply VCC falls below the threshold Vth may significantly reduce the current consumed by the non-volatile memory system 100 and in turn, facilitate the host system 102 in bringing back up and stabilizing the level of the supply voltage VCC.

In addition, although the supply voltage management system 124 is shown as a component of the non-volatile memory system 100 that is separate from the analog circuitry 114 and the core logic circuitry 106, all or some of the components of the supply voltage management system 124 shown in FIG. 2 may be part of either the analog circuitry 114 and/or the core logic circuitry 106. Various configurations are possible.

Also, in general, a module, such as it is used for the activation module 210, the initialization module 212, the time period module 214, and the time period counter module 216, may be hardware or a combination of hardware and software. For example, each module may include an application specific integrated circuit (ASIC), a field programmable gate array (FPGA), a controller, a circuit or circuitry, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

Figure 3:
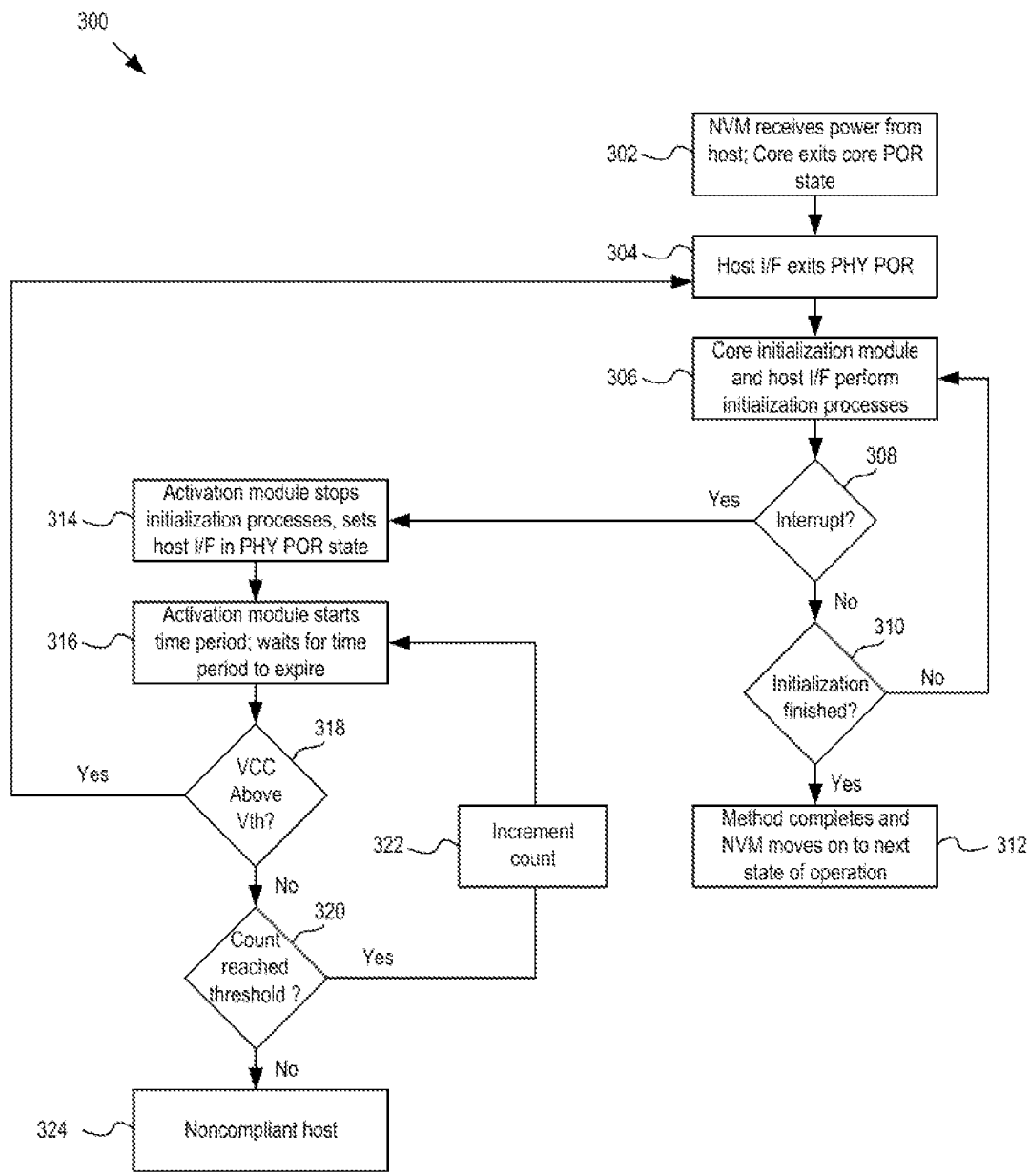
FIG. 3 is a flow chart of an example method of handling initialization processes while monitoring a level of a supply voltage.

FIG. 3 shows a flow chart of an example method 300 of handling initialization processes while monitoring a level of a supply voltage. At block 302 a non-volatile memory system may receive a supply voltage VCC from a host system. Upon receipt, core logic circuitry of the non-volatile memory system may exit a core POR state. At block 304, in response to the core exiting the core POR state, a host interface may exit a PHY POR state. At block 306, a core initialization module and the host interface may begin performing respective initialization processes, as previously described.

At block 308, an activation module may detect whether it has received an interrupt. The interrupt may be generated by an interrupt circuit if a level of the supply voltage VCC has dropped below a threshold. A supply voltage detection circuit may be receiving the supply voltage VCC and comparing the supply voltage level with a reference, such as a reference voltage range. When the level of the supply voltage VCC falls below the threshold, the supply voltage detection circuit may transition its output from a first level to a second level. The interrupt circuit may detect the transition, and in response, output the interrupt signal to the activation module. At block 308, if the interrupt signal has not been generated, then the method may proceed to block 310, where the core initialization module and the host interface may determine whether they have finished performing their respective initialization processes. If so, then the method may complete at block 312 and the non-volatile memory system may transition to a next operation state. An example state may be a ready state where the non-volatile memory system is ready to receive host commands from the host system. In general, at blocks 306-310 may involve the core initialization module and the host interface performing initialization processes after exiting respective POR states until they finish or unless an interrupt signal is generated before they finish their initialization processes prior due to a level of the supply voltage VCC falling below a threshold.

Referring back to block 308, if an interrupt signal is generated due to the level of the supply voltage VCC falling below the threshold, then at block 314, the activation module may transition the host interface back into the PHY POR state and stop the initialization processes. At block 316, the activation module 316 may start a time period and wait for the time period to expire. At block 318, when the time period expires, the activation module may check whether the level of the supply voltage VCC has increased to above the threshold Vth. In some example methods, the activation module may access indicator storage, such as a register, and identify a value of an indicator being stored in the indicator storage. As previously described, the value of the indicator may be set by the supply voltage detection circuit and/or correspond to the output of the supply voltage detection circuit and may indicate whether the level of the supply voltage VCC has increased back to above the threshold. If so, then the method may proceed back to block 304, where the activation module may release the host interface from the PHY POR state.

Alternatively, at block 318, if the level of the supply voltage is still below the threshold after expiration of the time period, then at block 320, the activation module may determine whether a time period count has reached a count threshold. If not, then at block 322, the activation module, such as a time period count module, may increment the time period count. The method may proceed back to block 316, where the activation module may start another time period. Alternatively, at block 320, if the activation module determines that the time period count has reached the count threshold, then the method may proceed to block 324, where the activation module may determine that the host system is noncompliant and that the memory system is not able to establish a connection and/or communicate with the host system.

Although the supply voltage management system 124 and related methods are described as being implemented for non-volatile memory systems, similar configurations and methods may be implemented with electronic systems, devices, and/or apparatuses other than non-volatile memory systems, including those that may communicate with a host system/device, receive a power supply voltage from the host system/device, and/or perform initialization processes. Such electronic systems, devices, and/or apparatuses may include circuit components similar to those of the supply voltage management system 124 described above.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

We claim:

1. An electronic device comprising:
    an interface configured to communicate with an external device;
    a supply voltage detection circuit configured to detect a supply voltage level relative to a threshold; and
    a controller configured to:
        stop execution of a core initialization process when the supply voltage level drops below the threshold; and
        resume execution of the core initialization process when the supply voltage level increases back to above the threshold.

2. The electronic device of claim 1, further comprising:
    a storage circuit configured to store a supply voltage level indicator that indicates whether the supply voltage level is above or has fallen below the threshold,
    wherein the controller is further configured to access the storage circuit to determine whether to activate the interface.

3. The electronic device of claim 2, wherein the supply voltage detection circuit is further configured to:
set the supply voltage level indicator to a first value upon detection that the supply voltage level has dropped below the threshold; and
set the supply voltage level indicator to a second value upon detection that the supply voltage level has increased back to above the threshold.

4. The electronic device of claim 1, further comprising:
an interrupt circuit configured to:
receive an output signal from the supply voltage detection circuit;
generate an interrupt signal when the output signal indicates that the supply voltage level has dropped below the threshold; and
output the interrupt signal to the controller,
wherein the controller is configured to deactivate the interface in response to receipt of the interrupt signal.

5. The electronic device of claim 1, wherein the controller is further configured to:
start a time period when the supply voltage level drops below the threshold; and
determine whether to activate the interface upon expiration of the time period.

6. The electronic device of claim 5, wherein the controller is further configured to:
increment a count index when the time period expires; and
identify that the external device is noncompliant for communication with the interface when the count index reaches a count threshold.

7. The electronic device of claim 1, wherein the threshold comprises a threshold range, wherein the controller is configured to deactivate the interface when the supply voltage level drops below the threshold range and to activate the interface when the supply voltage level increases back to above the threshold range.

8. An electronic device comprising:
an interface configured to communicate with a host system;
a supply voltage detection circuit configured to detect that a supply voltage level has dropped below a threshold; and
a controller configured to:
deactivate the interface in response to the detection that the supply voltage level has dropped below the threshold;
in response to the deactivation of the interface, start a predetermined time period and wait for the predetermined period to expire; and
in response to a determination that the predetermined time period has expired, check whether to activate the interface.

9. The electronic device of claim 8, wherein the controller is further configured to:
after deactivation of the interface, reactivate the interface when the supply voltage level increases to above the threshold.

10. The electronic device of claim 9, wherein the threshold comprises a threshold range, wherein the controller is configured to deactivate the interface when the supply voltage level drops below the threshold range and reactivate the interface when the supply voltage level increases back to above the threshold range.

11. The electronic device of claim 8, further comprising:
an interrupt circuit configured to:
receive an output signal from the supply voltage detection circuit;
generate an interrupt signal when the output signal indicates that the supply voltage level has dropped below the threshold; and
output the interrupt signal to the controller,
wherein the controller is configured to deactivate the interface in response receipt of the interrupt signal.

12. The electronic device of claim 8, wherein the controller is further configured to:
identify a value of an indicator when each of the plurality of time periods expires to determine whether to reactivate the interface.

13. An electronic device comprising:
means for transitioning an output signal from a first level to a second level in response to a supply voltage level falling below a threshold;
means for generating an interrupt signal in response to the transitioning;
means for deactivating a host interface configured for communication with a host system in response to detecting the interrupt signal; and
means for checking whether the supply voltage level has increased to above the threshold after each of a plurality of time periods until either the supply voltage level has increased to above the threshold, or a predetermined number of the time periods has elapsed and the supply voltage level has not increased to above the threshold.

14. The electronic device of claim 13, further comprising:
means for activating the host interface when the supply voltage level increases to above the threshold prior to a last of the predetermined number of time periods expiring.

15. The electronic device of claim 14, further comprising:
means for identifying that the host system is noncompliant for communication with the electronic device when the last of the predetermined number of time periods expires and the supply voltage level has not increased to above the threshold.

16. The electronic device of claim 13, further comprising:
means for storing a supply voltage level indicator that indicates whether the supply voltage level is above or below the threshold,
wherein the means for checking whether the supply voltage level has increased to above the threshold comprises means for accessing the storage circuit to determine a value of the supply voltage level indicator.

17. The electronic device of claim 16, further comprising:
means for setting the value of the supply voltage level indicator to correspond to the first level or the second level of the output signal.

18. The electronic device of claim 13, further comprising:
means for stopping a core initialization process in response to detecting the interrupt signal.

19. The electronic device of claim 13, wherein the threshold comprises a threshold range, and wherein the means for transitioning the output signal comprises means for transitioning the output signal from the first level to the second level in response to the supply voltage level falling from above a high level of the threshold range to below a low level of the threshold range, the electronic device further comprising:
means for transitioning the output signal from the second level back to the first level in response to the supply voltage level increasing from below the low level of the threshold range to above the high level of the threshold range.

20. The electronic device of claim 1, wherein the controller is further configured to:
   deactivate the interface when the supply voltage level drops below the threshold; and
   activate the interface when the supply voltage level increases back to above the threshold.

* * * * *